United States Patent [19]

Nelson

[11] Patent Number: 4,556,449
[45] Date of Patent: Dec. 3, 1985

[54] NICKEL ETCHING PROCESS AND SOLUTION

[75] Inventor: Norvell J. Nelson, Palo Alto, Calif.

[73] Assignee: PSI Star, Hayward, Calif.

[21] Appl. No.: 661,143

[22] Filed: Oct. 15, 1984

[51] Int. Cl.[4] ............................................. C23F 1/02
[52] U.S. Cl. .................................. 156/659.1; 156/656;
156/664; 156/902; 252/79.2; 252/79.4
[58] Field of Search .................... 156/656, 659.1, 664,
156/902; 252/79.2, 79.3, 79.4, 142; 134/3, 41

[56] References Cited

U.S. PATENT DOCUMENTS 4,302,246 11/1981 Brindisi et al. ................ 252/79.4 X Primary Examiner—William A. Powell
Attorney, Agent, or Firm—Flehr, Hohbach, Test, Albritton & Herbert

[57] ABSTRACT

Process and solution for etching nickel and nickel alloys, particularly suitable for use in the manufacture of printed circuit boards. The nickel or alloy is contacted with an aqueous solution of nitric acid, nickel nitrate, a halogen additive and a surfactant. In some embodiments, a small amount of an amino acid is included in the solution to enhance the smoothness of the edges of the etched patterns.

17 Claims, No Drawings

NICKEL ETCHING PROCESS AND SOLUTION

This invention pertains generally to the etching of nickel and nickel alloys, and more particularly to a process and system which are particularly suitable for removing nickel in the manufacture of printed circuit boards.

Although nickel is thermodynamically reactive and should readily dissolve in any dilute mineral acid with liberation of hydrogen, it is often found to be quite unreactive toward such reagents. This is because nickel readily "passivates" or forms a very adherent oxide layer which is kinetically resistant to further reaction. This is particularly true for reactions with nitric acid, especially concentrated nitric acid solutions. Consequently, most etching solutions for nickel contain chloride species, e.g. ferric chloride and cupric chloride. A mixture of acetic acid, phosphoric acid and nitric acid will etch nickel, but it is considered hazardous because of possible runaway reactions between acetic and nitric acids, resulting in explosions. Due to the tenacity of the native oxide on nickel, these etching processes are often limited with regard to surface reaction rate, and this can result in grain delineation and ragged edges in etched patterns.

It is in general an object of the invention to provide a new and improved process and solution for etching nickel and nickel alloys.

Another object of the invention is to provide a process and solution of the above character which overcome the foregoing and other problems of nickel etching processes heretofore provided.

Another object of the invention is to provide a process and solution of the above character which are particularly suitable for use in the manufacture of printed circuit boards.

Another object of the invention is to provide a process and solution of the above character which are particularly suitable for use in etching constantin and other nickel-copper alloys.

These and other objects are achieved in accordance with the invention by contacting the nickel with a solution containing nitric acid, nickel nitrate, a halogen additive and a surfactant. In some embodiments, a small amount of amino acid is added to the solution to enhance the smoothness of the edges of the etched patterns. It is somewhat surprising that nitric acid will etch nickel at all in view of the passivation problem discussed above. In addition, the combination of the halogen additive and the surfactant are found to have an unexpected synergistic effect in that the etch rate for nickel in the presence of both species is considerably faster than would be expected from a simple combination of the etch rates observed separately for each of these species.

U.S Pat. No. 4,497,687 (Ser. No. 563,683, filed Dec. 20, 1983) discloses a process for etching copper and other metals utilizing an aqueous solution of nitric acid and a dissolved salt of the metal to be etched. An example is given for etching nickel with a solution of 500cc of 50% nickel nitrate ($Ni(NO_3)_2$), 125cc of 70% nitric acid ($HNO_3$) and 7% Separan CP-7HS (Dow Chemical poly(acrylamide)), with about 0.36g of Ni being removed from a 1"×6" piece of nickel foil in one minute at a temperature of 45° C. It has now been found that the addition of a halogen additive such as periodic acid ($H_5IO_6$) provides a very active etching solution that will etch through a 0.5 mil nickel foil in less than 30 seconds in a controllable manner with moderately straight edges, independent of the initial crystallinity of the foil. In addition, it has been found that the addition of a small amount of an amino acid such as glycine or 5-aminocaproic acid enhances the smoothing action of the etching process such that extremely smooth and straight structures can be etched in nickel foil with little sacrifice in etching speed. The presence of the amino acid also reduces the tendency of the etch to undercut the etch resist pattern used to delineate the desired circuit.

The nickel etching process of the invention is illustrated by the following examples. A base solution consisting of a mixture of 400cc of a nickel nitrate solution (specific gravity 1.435) and a 200cc of 70% nitric acid is used in Examples 1 through 5.

EXAMPLE 1

Eighty cc of the base solution was heated to 40° C. A 1"×2½" piece of nickel foil laminate having a thickness on the order of 0.0005 inch was immersed in this solution for two minutes. There was no discernible surface reaction in this time. Weight loss of the nickel during this time was 0.0008g.

EXAMPLE 2

One cc of a 50% solution of periodic acid ($H_5IO_6$) with a specific gravity of 1.58 was added to the solution in Example 1. The solution was reheated to 40° C., and a similar sample was then immersed in the solution for two minutes. During this time, 0.1194g of the nickel foil was dissolved; complete dissolution of all the exposed nickel foil was not achieved in this time.

EXAMPLE 3

0.5cc of FC-100, a 3M amphoteric fuorosurfactant, was added to 80cc of the base solution, and this solution was heated to 40° C. A nickel foil sample similar to that utilized in the other examples was immersed in this solution for two minutes, and this sample showed little sign of reaction in the form of gas evolution from the metal surface. During this time 0.0130g of the nickel foil was dissolved.

EXAMPLE 4

0.5cc of FC-100 was added to the solution used in Example 2, and this solution was reheated to 40° C. A similar nickel foil laminate sample was then immersed in the solution. The dissolution reaction began immediately as evidenced by the rapid evolution of gas bubbles from the Ni surface. The exposed nickel foil, 0.1392g, was completely removed in 40 seconds.

EXAMPLE 5

Eighty cc of the base solution was mixed with 1 cc of 50% periodic acid, 0.5cc of FC-100 and 1 cc of a 20% solution of 5-aminocaproic acid. The standard nickel foil sample was completely cleared of exposed nickel in 50 seconds at 43° C. The resulting nickel pattern showed good line form and shape.

EXAMPLE 6

A mixture of 500cc of a nickel nitrate solution (specific gravity 1.44), 300cc of 70% nitrate acid, 10cc of a 50% periodic acid solution, 5cc of FC-100 and 5cc of a 3.3M solution of glycine nitrate was mixed and heated to 40° C. This solution was used to etch a 6" square of 0.5 mil nickel foil laminated to a 1 mil Kapton substrate, with a resist pattern of Riston 210 formed on the surface of the nickel. The exposed nickel foil was completely removed within 85 seconds, and the remaining nickel pattern had extremely smooth and straight line patterns with a very uniform cross-section.

At this time, it is believed that the periodic acid controls the overall oxidation potential of the etching solution at some level below that of I(VII), $IO_4{-}$, to possibly that of iodate I(V), $IO_3{-}$, or some species between I(V) and I(0), elemental iodine. Elemental iodine is not noted in an actively reacting solution but is slowly released when etching is stopped and the solution is cooled. The added iodine may also be important for penetration of the nickel oxide layer. Other halogen additives may also be used, including bromine (as either $Br^-$ or $BrO_3^-$) or chlorine ($Cl^-$), but they may not be as effective as the iodine species in promoting the etching reaction.

In addition to providing a relatively fast, controllable reaction for removing nickel, the process and etching solution of the invention also provide relatively smooth lines at the edges of the etched pattern. The nickel foil commonly has a fairly large crystal grain structure, and without the halogen additive and the surfactant, lines etched with nitric acid and nickel nitrate have very ragged edges, with irregularities exceeding the thickness of a 0.5 mil foil. Under these conditions, thinner lines (e.g. 2 mil) are very irregular. With the invention, however, the edges of the etched lines are extremely straight and uniform, and the patterns have a rectangular cross-section.

In addition to etching pure nickel, the process and solution disclosed herein can also be used for etching nickel-copper alloys and other alloys of nickel. One such alloy is constantin, which comprises on the order of 45–60% copper and 40–55% nickel.

It is apparent from the foregoing that a new and improved process and solution for etching nickel have been provided. While only certain presently preferred embodiments have been described in detail, as will be apparent to those familiar with the art, certain changes and modifications can be made without departing from the scope of the invention as defined by the following claims.

I claim:

1. In a process for etching nickel or a nickel alloy: contacting the nickel or alloy with a solution containing nitric acid, nickel nitrate, a halogen additive and a surfactant.

2. The process of claim 1 wherein the solution also contains a relatively small amount of an amino acid.

3. The process of claim 1 wherein the solution is heated to a temperature on the order of 40° C.

4. The process of claim 1 wherein the halogen additive is periodic acid.

5. The process of claim 1 wherein the solution is an aqueous solution containing on the order of 15–25 parts nitric acid, 40–60 parts nickel nitrate, 0.5–1.0 part periodic acid and 0.5–1.0 part surfactant.

6. The process of claim 5 wherein the solution also contains on the order of 0.5–1.0 part amino acid.

7. In a process for etching nickel or a nickel alloy: contacting the nickel or alloy with an aqueous solution containing on the order of 15–25 parts nitric acid, 40–60 parts nickel nitrate, 0.5–1.0 part $H_5IO_6$ and 0.5–1.0 part fluorosurfactant.

8. The process of claim 7 wherein the nickel is in the form of a relatively thin layer on a substrate, etch resist material is applied to portions of the nickel to be retained, and on the order of 0.5–1.0 part amino acid is included in the solution to promote the removal of nickel along a smooth clean line at the edge of the resist material.

9. The process of claim 8 wherein the amino acid is selected from the group consisting of glycine, 5-aminocaproic acid and glycine nitrate.

10. The process of claim 7 wherein the solution is heated to a temperature on the order of 40° C.

11. The process of claim 8 wherein the alloy is a nickel-copper alloy containing on the order of 40–55% nickel and 45–60% copper.

12. A solution for etching nickel and nickel alloys, comprising a mixture of nitric acid, nickel nitrate, a halogen additive and a fluorosurfactant.

13. The solution of claim 12 including a relatively small amount of an amino acid.

14. The solution of claim 12 wherein the halogen additive is periodic acid.

15. The solution of claim 12 wherein the solution contains on the order of 15–25 parts nitric acid, 40–60 parts nickel nitrate, 0.5–1.0 part periodic acid and 0.5–1.0 part surfactant.

16. The solution of claim 15 wherein the solution also contains on the order of 0.5–1.0 part amino acid.

17. The solution of claim 16 wherein the amino acid is selected from the group consisting of glycine, 5-aminocaproic acid and glycine nitrate.

* * * * *